US012783907B2

(12) United States Patent
Varro et al.

(10) Patent No.: US 12,783,907 B2
(45) Date of Patent: Nov. 3, 2026

(54) AUTOMATIC FUNCTIONALITY CLUSTERING OF DESIGN PROJECT DATA WITH COMPLIANCE VERIFICATION

(71) Applicant: Siemens Aktiengesellschaft, Munich (DE)

(72) Inventors: Andras Varro, Lawrenceville, NJ (US); Elisabeth Heindl, Cadolzburg (DE); Nataliia Ruemmele, Munich (DE); Martin Witte, Schwabach (DE); Gustavo Arturo Quiros Araya, Princeton, NJ (US); Thomas Trenner, Fuerth (DE)

(73) Assignee: Siemens Aktiengesellschaft, Munich (DE)

( * ) Notice: Subject to any disclaimer, the term of this patent is extended or adjusted under 35 U.S.C. 154(b) by 766 days.

(21) Appl. No.: 18/005,864

(22) PCT Filed: Aug. 12, 2020

(86) PCT No.: PCT/US2020/045893
§ 371 (c)(1),
(2) Date: Jan. 18, 2023

(87) PCT Pub. No.: WO2022/035427
PCT Pub. Date: Feb. 17, 2022

(65) Prior Publication Data

US 2023/0281486 A1 Sep. 7, 2023

(51) Int. Cl.
*G06N 5/02* (2023.01)
*G06F 30/12* (2020.01)
(Continued)

(52) U.S. Cl.
CPC ............... *G06N 5/02* (2013.01); *G06F 30/12* (2020.01); *G06F 30/27* (2020.01); *G06N 5/022* (2013.01); *G06N 5/025* (2013.01); *G06Q 10/101* (2013.01)

(58) Field of Classification Search
CPC ............ G06N 5/04; G06N 5/02; G06N 5/025; G06N 5/022; G06F 30/12; G06F 30/27; G06F 11/3438; G06Q 10/101; G06Q 10/0633; G06Q 10/067
See application file for complete search history.

(56) References Cited

U.S. PATENT DOCUMENTS 8,949,233 B2 * 2/2015 Hsiao ..................... G06N 5/022
707/735
10,157,347 B1 * 12/2018 Kasturi .................. G06N 20/10
(Continued)

FOREIGN PATENT DOCUMENTS

CN 103268390 A 8/2013
CN 108701352 A 10/2018
(Continued)

OTHER PUBLICATIONS

Mills, Kevin L., and Hassan Gomaa. "Knowledge-based automation of a design method for concurrent systems." IEEE Transactions on Software Engineering 28.3 (2002): 228-255. (Year: 2002).*
(Continued)

*Primary Examiner* — Andrew L Tank

(57) ABSTRACT

System and method use an engineering software tool to construct a graphical design of an industrial system for a design project and an artificial intelligence (AI) module integrated with the engineering tool to classify functionality of components for a current design project using a trained machine learning-based model. The AI module receives a knowledge graph for the current project based on data associated with the graphical design. The knowledge graph represents an ontology for a set of elements and element
(Continued)

relationships respectively, representative of system components. The AI module identifies a functionality for each knowledge graph node based on the classifier model, clusters knowledge graph nodes according to identified functionality, and generates functionality-based recommendations based on the clusters in response to user queries. Compliance validation of the design data to regulation standards and policy is performed at the component level by an inference engine.

16 Claims, 6 Drawing Sheets

(51) Int. Cl.

| | |
|---|---|
| ***G06F 30/27*** | (2020.01) |
| ***G06N 5/022*** | (2023.01) |
| ***G06N 5/025*** | (2023.01) |
| ***G06Q 10/101*** | (2023.01) . |

(56) References Cited

U.S. PATENT DOCUMENTS

| | | | | |
|---|---|---|---|---|
| 10,496,678 | B1 * | 12/2019 | Tang | G06F 16/282 |
| 10,949,455 | B2 * | 3/2021 | Reh | G06Q 10/067 |
| 2015/0178273 | A1 * | 6/2015 | Hakkani-Tur | G06F 40/40 704/9 |
| 2018/0103052 | A1 * | 4/2018 | Choudhury | H04L 63/20 |
| 2018/0349511 | A1 * | 12/2018 | Kleiman-Weiner | G06F 16/36 |
| 2019/0018904 | A1 * | 1/2019 | Russell | G06F 16/9024 |
| 2019/0042988 | A1 * | 2/2019 | Brown | G06F 16/9535 |
| 2019/0121801 | A1 * | 4/2019 | Jethwa | G06F 16/243 |
| 2019/0163835 | A1 * | 5/2019 | Scheideler | G06F 16/9024 |
| 2019/0220524 | A1 * | 7/2019 | Costabello | G06F 16/24578 |
| 2019/0340306 | A1 * | 11/2019 | Harrison | G06N 5/04 |
| 2020/0081445 | A1 * | 3/2020 | Stetson | G05D 1/0221 |
| 2020/0104723 | A1 * | 4/2020 | Reissner | G06F 8/38 |
| 2020/0110589 | A1 * | 4/2020 | Bequet | G06N 3/08 |
| 2020/0159950 | A1 * | 5/2020 | Bodin | G06Q 50/01 |
| 2021/0019456 | A1 * | 1/2021 | Mirabella | G06F 30/20 |
| 2021/0089860 | A1 * | 3/2021 | Heere | G06N 20/00 |
| 2021/0096827 | A1 * | 4/2021 | Stump | G05B 13/0265 |
| 2021/0304063 | A1 * | 9/2021 | Bulut | G06N 5/04 |
| 2022/0060541 | A1 * | 2/2022 | Shokooh | H04L 67/1095 |

FOREIGN PATENT DOCUMENTS

| | | | | |
|---|---|---|---|---|
| CN | 111095139 A | | 5/2020 | |
| CN | 111159249 A | | 5/2020 | |
| CN | 111292821 A | | 6/2020 | |
| CN | 111435409 A | | 7/2020 | |
| WO | WO-2019103775 A1 | * | 5/2019 | G06F 30/20 |

OTHER PUBLICATIONS

Wang, Hui, and Yiming Kevin Rong. "Case based reasoning method for computer aided welding fixture design." Computer-Aided Design 40.12 (2008): 1121-1132. (Year: 2008).*

Lattner, Andreas D., et al. "A knowledge-based approach to automated simulation model adaptation." Proceedings of the 2010 Spring Simulation Multiconference. 2010. (Year: 2010).*

Islam, Shareeful, Haralambos Mouratidis, and Jan Jürjens. "A framework to support alignment of secure software engineering with legal regulations." Software & Systems Modeling 10.3 (2011): 369-394. (Year: 2011).*

Pujara, Jay, et al. "Ontology-aware partitioning for knowledge graph identification." Proceedings of the 2013 workshop on Automated knowledge base construction. 2013. (Year: 2013).*

Stjepandić, Josip, et al. "Knowledge-based engineering." Concurrent engineering in the 21st century: foundations, developments and challenges. Cham: Springer International Publishing, 2015. 255-286. (Year: 2015).*

Berquand, Audrey, et al. "Artificial intelligence for the early design phases of space missions." 2019 IEEE Aerospace Conference. IEEE, 2019. (Year: 2019).*

Kwon, Jihye, Matthew M. Ziegler, and Luca P. Carloni. "A learning-based recommender system for autotuning design flows of industrial high-performance processors." Proceedings of the 56th Annual Design Automation Conference 2019. 2019. (Year: 2019).*

Viros Martin, Antoni, and Daniel Selva. "From design assistants to design peers: Turning daphne into an AI companion for mission designers." AIAA Scitech 2019 Forum. 2019. (Year: 2019).*

Canedo, Arquimedes, et al. "ArduCode: Predictive Framework for Automation Engineering." arXiv preprint arXiv:1909.04503v4 (2020). (Year: 2020).*

Antoni, Viros I et al: "Daphne: A Virtual Assistant for Designing Earth Observation Distributed Spacecraft Missions"; IEEE Journal of Selected Topics in Appliedearth Observations and Remote Sensing; vol. 13; Nov. 14, 2019;pp. 30-48; XP011771723; DOI: 10.1109/JSTARS.2019.2948921.

Krishnan, Jitin et al: "SEVA: A Systems Engineer's Virtual Assistant"; AAAI 2019 Spring Symposium on Combining Machine Learning with Knowledge Engineering; Mar. 25, 2019; XP055739542; Retrieved from the Internet: URL: http://ceur-ws.org/Vol-2350/paper3.pdf.

Evripidou, Valentinos et al: "Argumentation-Based Collaborative Decisions for Design"; IEEE 26th International Conference on Tools With Artificial Intelligence; Nov. 10, 2014; pp. 805-809; XP032703798;DOI: 10.1109/ICTAI.2014.124.

Martin Antoni Viros i et al:"A Virtual Assistant for Designing Earth Observation Distributed Spacecraft Missions", IEEE Journal of Selected Topics in Applied Earth Observations and Remote Sensing, vol. p. 30-48, Nov. 14, 2019.

Martin Antoni Viros I et al : "Daphne: A Virtual Assistant for Designing Earth Observation Distributed Spacecraft Missions", IEEE Journal of Selected Topics in Applied Earth Observations and Remote Sensing, p. 30-48, vol. 13, 2020.

Yang Bingcheng et al:"The Development and Application of Bridge ICAD System", Journal of Xi 'an High way University, vol. 18 No. 4(B), p. 127-131, Oct. 1998.

Chen Yuan et al:"Knowledge-Management-Based BIM Model Building Design Compliance Automated Inspection System Study", journal of graphics, vol. 41, No. 3, DOI : 10.11996/JG.j.2095-302X.2020030490, p. 490-499, Jun. 30, 2020.

* cited by examiner

AUTOMATIC FUNCTIONALITY CLUSTERING OF DESIGN PROJECT DATA WITH COMPLIANCE VERIFICATION

TECHNICAL FIELD

This application relates to computer aided design (CAD). More particularly, this application relates to enhancement of CAD with an artificial intelligence advisor for automatic contextual recognition and clustering of design data by functionality and for verification of compliance with standards and policies.

BACKGROUND

When designing industrial systems in the course of design projects, engineers rely on various engineering tools in the CAD domain including various software packages and applications tailored for one or more disciplines or domains of an industry, such as electrical, mechanical, automation, etc. Typically, an engineering tool presents the project design as a 2D or 3D rendering, with various components of a system design configured in a connected arrangement according to the design. Other presentations may include tables or lists of components that are presently part of the project design. During the course of project design via such engineering tools, recognizing and classifying components (e.g., parts and devices) of a system design project is a must in order to understand how the various system parts operate individually and cooperatively within in the project. For example, a design project may relate to modeling a layout of robotic and conveyor components for an automation factory intended to serve a production line. A complex factory may involve a multitude of component types, each to serve a designated function that collaboratively achieve an objective. Tracking of a component's function and interactive role in the overall system is important as design decisions are being made, as there are contributary relationships among the many components. There is also a need to comply with an increasing number of standards and policies as components are added to a design project. Today, engineers must rely on manual standard and policy compliance check, which requires considerable time and effort and is prone to error. Failure of a designed system to comply with effective regulations can have severe consequences.

Application of an Artificial Intelligence (AI) feature can be helpful to provide recommendations that can guide an engineer during the CAD-based industrial design process. While an AI system can learn to recognize components, the extent of recognition is conventionally restricted to classification of a component by object type since components are self-describing entities (e.g., motor, function block, data block). What today's AI systems lack in the industrial design setting is the ability to readily recognize functionality of the component for contextual classification. Conventional AI systems also fail to provide an automated compliance verification service for industrial system design for assistance with enforcement of standards and policies.

SUMMARY

A software solution for computer aided design applications used for design projects is disclosed which incorporates an industrial AI-based assistant feature to classify system components using contextualization and to advise the user with recommendations for the design components according to functionality while operating an engineering software tool. The software solution also performs automated standard and policy compliance verification for engineering validation of the design project.

In an aspect, a method for computer aided design includes training a machine learning-based model using training data obtained from previous design projects to construct a trained machine learning-based model that classifies functionality of components for a current design project. An engineering software tool constructs a graphical design of an industrial system for a design project, the graphical design having a plurality of components. A knowledge graph is constructed for the current project based on data associated with the graphical design, the knowledge graph having nodes and edges representing an ontology for a set of elements and element relationships respectively, with the set of elements including the plurality of components. An artificial intelligence (AI) module runs integrated with the engineering tool during a current project, the AI module using the trained machine learning-based model to classify functionality of project components. The AI module identifies a functionality for each knowledge graph node based on the classifier model, and clusters knowledge graph nodes according to identified functionality. A cluster diagram may be generated and displayed having distinct functionality clusters on a portion of the display as an AI-based assistant feature based on the clustering to provide a visual aid to the user with functionality classifications in the graphical design. Validation of the engineering design data is performed by an inference engine using rules based inference.

BRIEF DESCRIPTION OF THE DRAWINGS

Non-limiting and non-exhaustive embodiments of the present embodiments are described with reference to the following FIGURES, wherein like reference numerals refer to like elements throughout the drawings unless otherwise specified.

DETAILED DESCRIPTION

Methods and systems are disclosed for enhancing an engineering tool by incorporating an AI-based assistant feature that learns contextual classification of components in a computer aided design project and presents functionality information to a user via a graphical user interface (GUI)

concurrently with operating an engineering tool that models an industrial system for the design project. The functionality may be displayed as clusters of functionally classified elements from a knowledge graph of the current system design. Additional assistance may be presented in the form of recommendations to the user relative to design elements, such as a notification that elements may be missing, or for determining technical parameters for the design. An AI module and/or inference engine may analyze the knowledge graph, construct functional clusters that reflect elements related to one another by a common functionality, and formulate the recommendations to the user during the design process. Such assistance solves a technical problem facing an engineer who opens a design project in an engineering tool, several years after the project was created by a different engineer, and days and weeks may be required to gain an understanding of just a single subsystem model, let alone many more subsystem models that need to be classified for the entire design project. The AI-based assistant feature can respond to detected potential policy or standard violations for compliance verification in the design project with a notification to a system user.

Figure 1:
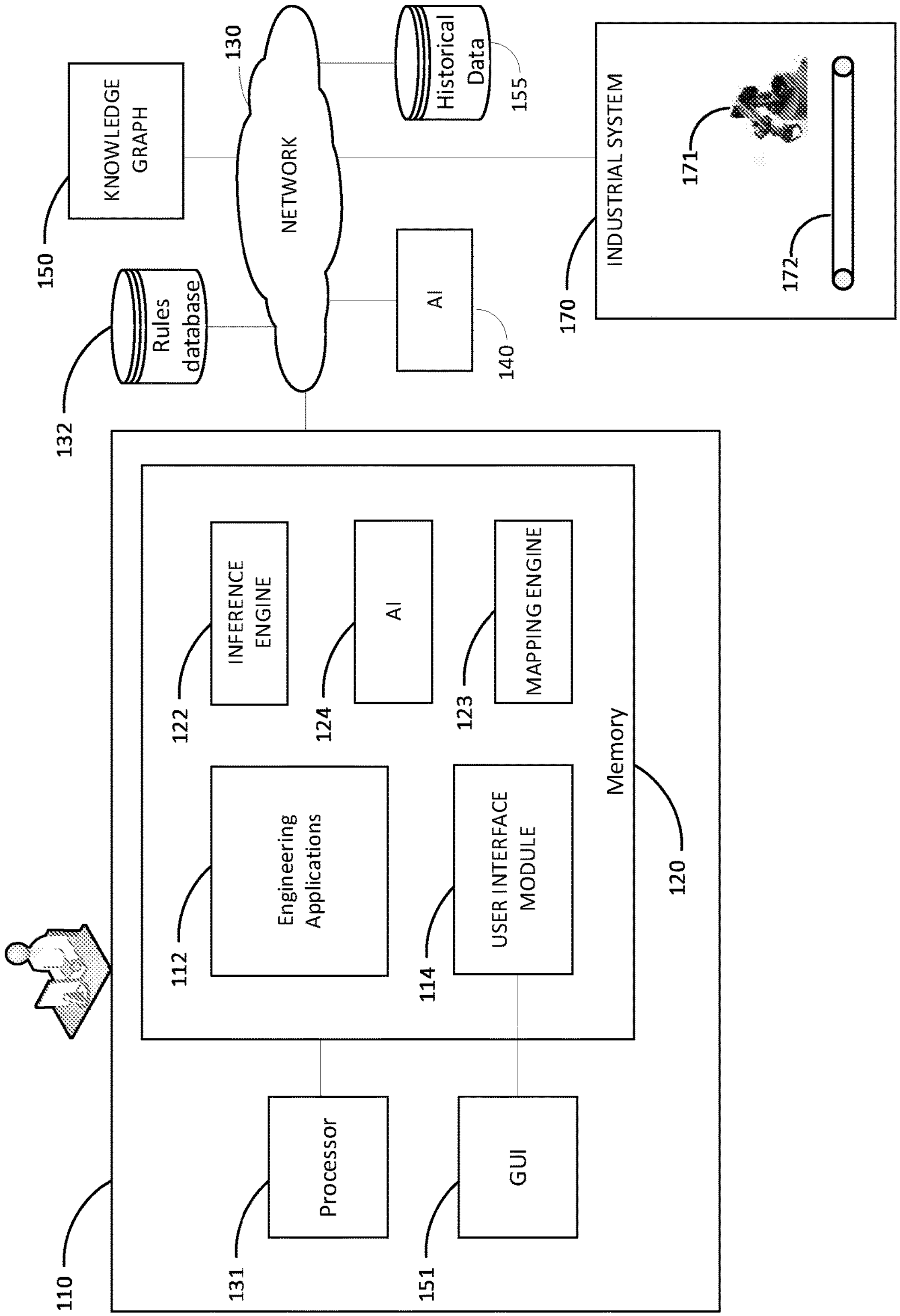
FIG. 1 is a block diagram for an example of a system for an industrial AI-based automatic contextualized clustering of design project functionality data in accordance with embodiments of the disclosure.

FIG. 1 is a block diagram for an example of a system for an industrial AI-based automatic contextualized clustering of design project functionality data in accordance with embodiments of the disclosure. In an embodiment, a design engineering project is performed for an industrial system 170, such as an automation system, having machines and sensors that can provide feedback. For example, an automation project may involve designing a robot 171 that interacts with a conveyor 172 to manipulate workpieces in a production line, including a control program that executes operation of the machine drivers in conjunction with sensor signals. Generally, given a set of pre-configuration information about the industrial plant to be designed, such as the environment, physical layout constraints, and the like, the industrial AI function of this disclosure supports design development, such as automation logic, determination of technical parameters, component interaction controls, configuration of components, and the like. A computing device 110 includes a processor 131 and memory 120 (e.g., a non-transitory computer readable media) on which is stored various computer applications, modules or executable programs. Engineering applications 112 may include software for one or more of modeling tools, a simulation engine, computer aided design (CAD) tools, and other engineering tools accessible to a user via a graphical user interface (GUI) 151 and a user interface module 114 that drives the display feed for GUI 151 and processes user inputs back to the processor 131, all of which are useful for performing plant design, such as in the form of 2D or 3D renderings or a design dashboard that provides various design views. A network 130, such as a local area network (LAN), wide area network (WAN), or an internet based network, connects computing device 110 to an artificial intelligence (AI) module 140 and a repository of knowledge graphs 150. AI module 124 may be implemented as local client module to interface with AI module 140, such as for queries and for receiving notifications or recommendation from AI module 140. In some embodiments, an inference engine 122 communicates with the repository of knowledge graphs 150 to perform rule-based analysis for AI-based assistance for the project design according to rules stored in rules database 132, and to perform a compliance verification for validation of engineering data. Mapping engine 123 may map extracted policy, regulation and standards data to rules database 132 to enable the validation of engineering data.

In an embodiment, engineering data is monitored during the course of multiple design projects, and the engineering data is organized into project specific knowledge graphs 150 as semantic data. In an aspect, a knowledge graph 150 may be generated for each engineering discipline operating a design project and/or a knowledge graph 150 may be created for the system design encompassing all active disciplines. Knowledge graphs 150 are generated using a knowledge graph algorithm that processes an ontology of data exported from an engineering application 112 (e.g., Siemens TIA Portal, ePlan, Process Simulate, etc.). The ontology governs, according to a particular ontology standard, what types of elements of a system and the relationships between the elements are present (e.g., motor control, logic function block, associated sensor signals). The ontology also describes properties of the elements and the element relationships, and may organize the element types into hierarchies, such as super-types and sub-types. A knowledge graph 150 represents the ontology as nodes and edges that correspond to a set of elements of the ontology and element relationships, respectively. An archive of knowledge graphs 150 may be accumulated over the course of many engineering design projects and stored as historical data 155. In an aspect, the ontologies used to create the knowledge graphs may be stored as indexed tables in historical data 155.

AI module 140 is configured to apply a classification technique (e.g., machine learning classification, natural language processing, pattern matching, data-flow analysis) to find interconnected components, classify the component functionality and tag the component accordingly. From this functionality classification, AI module 140 can provide functionality based recommendations to the user through the AI-based assistant. In an embodiment, the AI module 140 includes a machine learning-based network trained by supervised or unsupervised training techniques to generate a machine learning model that can recognize the different parts of the project based on the connections and the properties of elements in the knowledge graph 150 for the current project. A data-driven approach may involve a machine learning model that is trained on labeled historical data 155. Such a model can be trained using graph clustering, graph/node classification or other classification models. Once trained, AI module 140 is used to analyze knowledge graphs 150 to classify components in a design project with contextualization according to functionality. Functionality context information can be presented to a user in the AI-based assistant feature at GUI 151 during a design project. In an aspect, AI module 124 interfaces as a client with a server-based AI module 140 over network 130 to conserve local memory, operating as a cloud-based AI scheme. In some embodiments, local AI module 124 may be implemented as an independent machine learning-based network capable of locally performing the tasks as described for the AI module 140 either entirely or in part as a shared role for the AI-based assistant feature.

Inference engine 122 is used to implement a rule-based approach, in which functionalities are described as graph queries over the ontology of the knowledge graph 150 (e.g., using SPARQL or Gremlin language), and the descriptions are stored in rules database 132. Rules may be defined by a user with assistance from a rule editor software application that, based on the ontology, allows for easy rule composition. Once defined, the rules are stored in rule database 132. Alternatively, the rules may be integrated into a knowledge graph ontology by a knowledge graph algorithm. An example of a defined rule may relate to defining functionality context based on a particular arrangement, configuration, and/or connected relationship of two or more components. A rule-based approach can also incorporate results from data mining techniques (e.g., natural language processing, graph clustering, data-flow analysis, etc.), whereby text from tab or label elements of historical knowledge graph data 155 is extracted and interpreted for functionality context and formulated into rule-based queries and stored in the rules database 132. In an embodiment, once the rules are defined and stored in the rules database 132 according to any of the above techniques, inference engine 122 analyzes new project data inputs by finding the relevant rules and applying rule-based inference on extracted structure features of structured data records in knowledge graph 150 for the current project to determine functionality clusters.

Inference engine 122 may also provide engineering validation feedback to the AI-based assistant displayed on GUI 151. In an embodiment, rules database 132 stores policies, standards and/or regulations for engineering design components. During configuration for a current design project, mapping engine 123 may be used to extract relevant policies, standards and/or regulations information, received from the user or extracted from the rules database 132 and/or documents of information sources, and map the extracted information to design elements of the historical data 155 to define rules-based relationships to project ontology, then stores the rules in rule database 132. During a validation for a running design project, inference engine 122 extracts relevant rules from the rules databased and applies the rules to new project data observed in knowledge graph 150 of the current project, seeking any discrepancy as a potential violation of policy, standards and/or regulations. Discrepancies may be reported to the user through the AI-based assistant feature.

Figure 2:
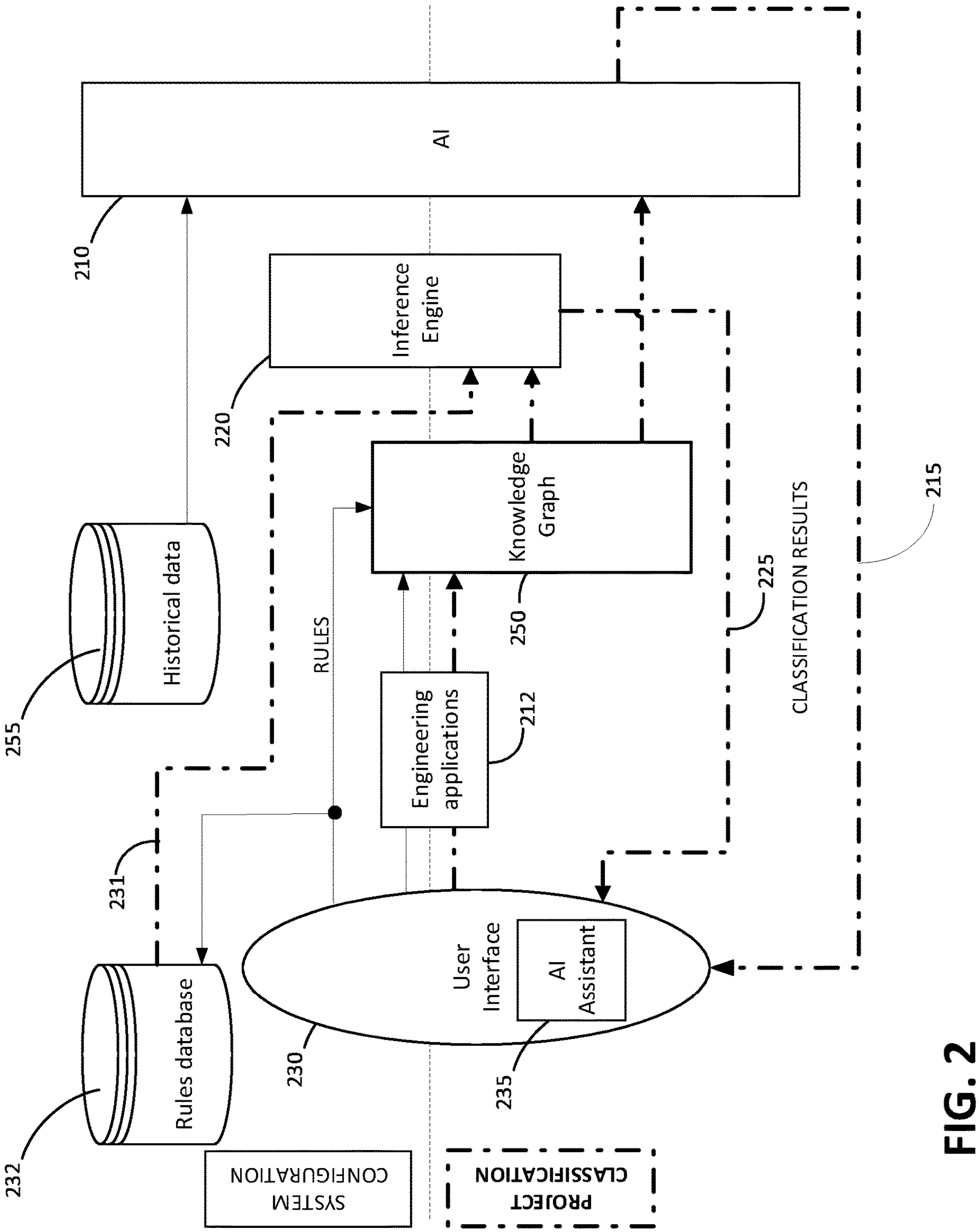
FIG. 2 shows a flowchart for an example of an industrial AI-based automatic contextualized clustering of design project functionality data in accordance with embodiments of the disclosure.

FIG. 2 shows a flowchart for an example of a process for an industrial AI-based automatic contextualized clustering of design project functionality data in accordance with embodiments of the disclosure. The system operates in a system configuration phase and a project classification phase. During the system configuration, AI module 210 is trained from historical data 255 to generate a trained machine learning model that classifies design project components with contextualization according functionality using a data-driven approach. For the rule-based approach, system configuration involves defining a specification of rules information defined for functionality of components from a user via graphical user interface 230 and stored in rules database 232. As a current design project is initiated, a project specific knowledge graph 250 is populated and configured according to ontology rules for the project, as design data is received in a first export from an engineering application 212. For example, an engineer may select a design template from an engineering tool, which then renders the components of the graphical design for the design template. The knowledge graph 250 may be constructed by extraction of data associated with the graphical design. During system configuration, as the engineer adds data to the project using engineering application 212, delta updates to the knowledge graph 250 are configured upon additional data exports. In some embodiments, rules may also be incorporated into the knowledge graph 250, for later extraction by inference engine 220 during the classification phase.

During a project classification phase, following a completed project configuration, the project design may be queried from the AI-based assistant 235, such as if the project is reopened and a user wishes submit a demand for classification information about the design, such as an overview of a particular system or subsystem (e.g., what functions are served by devices in subsystem X?). To perform project classification, AI module 210 may execute component classifications according to functionality, based on the state of the knowledge graph 250 as constructed during configuration phase, while an engineering tool is concurrently in use, such as one of engineering applications 212 (e.g., ePlan, Process Simulate, TIA Portal Hardware Configuration, TIA Portal PLC Software, etc.). To execute the classifications, industrial AI module 210 extracts connected information from knowledge graph 250, and applies a classification technique (e.g., classification, natural language processing, pattern matching, data-flow analysis, etc.) by which interconnected components are identified and classified according to functionality. Using this information, the classification results 215 are fed to the user interface 230, which may include a graphical representation of the components by clustered functionality, described below with reference to FIG. 3A, and/or functionality-based recommendations presented to the user in the AI-based assistant feature 235. For example, using the knowledge graph, the AI module 210 views the system design with contextual perspective, such as identifying the classification of parts which can assist the engineer when modifying a component. For instance, to adjust the maximum speed of a given conveyor, the AI-based assistant can identify, via the contextual functionality clustering, which components are part of the conveyor and technical parameters of the components that relate to the required adjustment. This aspect of a computer-implemented method for designing an industrial system solves the technical problem of accessing design components by functionality rather than by name, which greatly accelerates the design process of complex automation systems and reduces error and inconsistencies. In an embodiment, the user interface 230 may include a display on which the screen is split to show the engineering application (e.g., TIA portal) on one side, with AI-based assistant feature 235 on the other side that includes a rendering of the classification clustering and/or recommendation messages from the industrial AI module 210.

In a separate process that may be implemented alternatively or additionally in the project classification phase, inference engine 220 analyzes knowledge graph 250 against the rules information 231. Using inference analysis, inference engine 220 recognizes clusters within the knowledge graph 250 and applies functionality rules to elements of the graph. For example, code or other software elements (e.g., comments, file structure or hierarchy, code organization, or the like) can be analyzed by the inference engine 220 according to the defined rules information 231 to identify functionality. In another embodiment, data mining can be applied to the knowledge graph 250 to extract the state of the project using text recognition algorithms (e.g., NLP) on textual nodes such as tags and labels. From the extracted meaning of the text and recognized structure patterns, inference engine 220 infers functional context from a comparison to the defined rules 232. The classification results 225 are sent to the user interface 230 for presentation in the AI-based assistant 235. A graphical representation of which is described below with reference to FIG. 3A.

Once the project components are classified by functionality, either by the data-driven approach or the rule-based approach, one technical improvement includes the ability to easily operate within the design project according to clustered functionality. For example, should it be discovered that a new requirement, constraint, or regulation has arisen, any necessary modifications can be made with confidence that all components for the target classification are captured (e.g., a new crane regulation can be implemented comprehensively and quickly for all components within the crane functionality cluster). In contrast, using conventional CAD based tools, there is no easy way to pinpoint all design components connected by a common functionality within the industrial system.

Figure 3A:
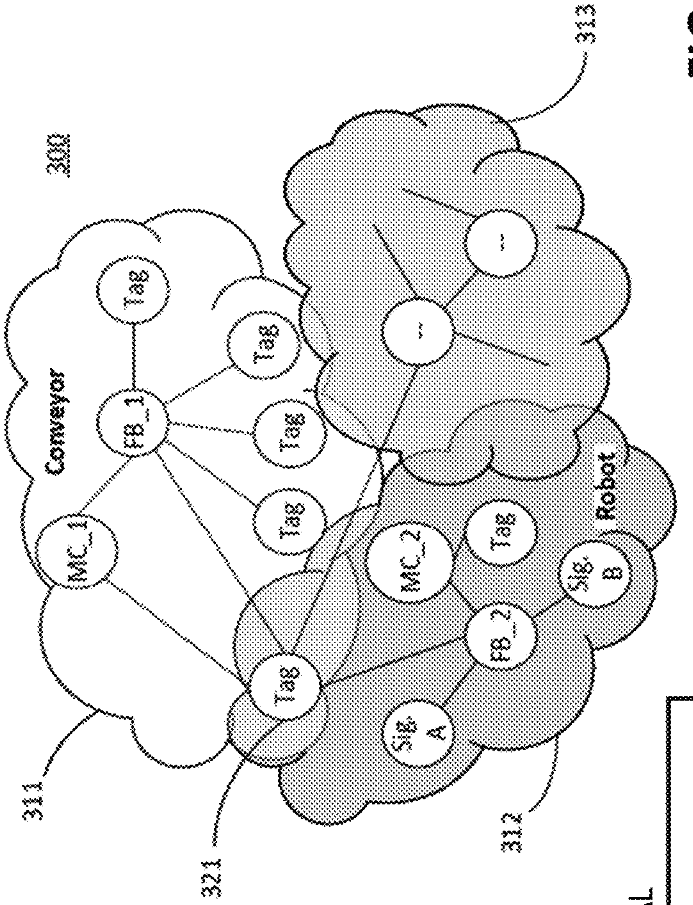
FIG. 3A shows an example of a clustering classification of project elements in accordance with embodiments of this disclosure.

FIG. 3A shows an example of a clustering classification representation of project elements in accordance with embodiments of this disclosure. In an embodiment, a cluster diagram 300 is generated from classification results 215, 225 to represent elements of knowledge graph 250 following a clustering analysis by AI module 210 and/or inference engine 220 according to classified functionality. For example, a design project may involve an automation design, including setting up control programs for a conveyor and a robot to interact for various tasks on a production line among other design aspects. Each element of the design may be evaluated by its associated ontological information and may be assigned to the respective functionality, such as conveyor cluster 311, robot cluster 312, and other clusters 313, together forming clustering diagram 300. In an embodiment, knowledge graph 250 may be restructured by AI module 210, inference engine 220 to form distinct clusters of nodes according to functionality, which may be rendered as clustering diagram 300 in FIG. 3A and displayed to the user on AI-based assistant feature 235 as a visual aid to the user with functionality classifications in the graphical design of the current design project. In an aspect, rendered clusters may be visually explored in 3D or 2D using GUI features such as zoom in/out, rotate, pivot, and the like. Robot cluster 312, as shown, includes a motor control node MC_2 and a function block node FB_2, which represent functionalities of a control element for a robot driver motor and a block of program for some particular function of the robot, respectively. Each node includes links to associated tag nodes that identify parameter values or characteristics for the respective node. For example, conveyor cluster node FB_1 may be linked to tags that indicate values for conveyor speed and running state. Some tags may be associated with signals, such as Sig. A and Sig. B for node FB_2. In some instances, a node may have characteristics associated with two or more clusters, such as tag 321, and cluster overlaps may be defined for such a node. Node classification to a functionality cluster may be according to the machine learning model, or the inference engine rules analysis, or both. In some embodiments, the knowledge graph 250 information may be classified by AI module 210, inference engine 220, and functionality clustering may be recorded by graphically altering the nodes in a manner that indicates which cluster a node belongs to (e.g., a unique color), without having to reorganize the knowledge graph into clusters. In some embodiments, the AI module 210 and/or inference engine 220 may determine that some components or features in the project design cannot be mapped with contextualization, meaning they are either non-standard functions or a result of a poor practice or design. In such instances, the AI-based assistant feature may recommend replacing the unmappable component or feature with a legitimate element or removing it from the design.

Figure 3B:
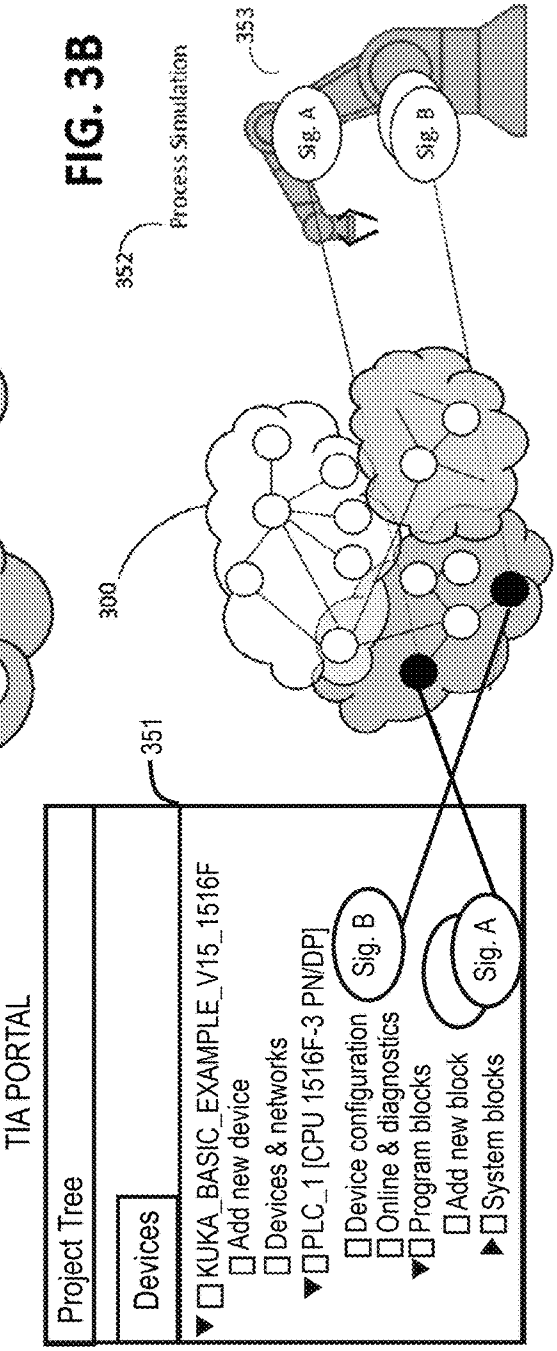
FIG. 3B shows an example of querying a functional clustering according to embodiments of this disclosure.

FIG. 3B shows an example of querying a functional clustering according to embodiments of this disclosure. In this example, a design project is being engineered for a production line that includes a robot working with other components like a conveyor belt. The design project is using a TIA portal hardware configuration program with a project tree screen 351 that can display a tabular list of devices and associated program blocks. As shown in the device table of screen 351, the target device is a Kuka robot, which is also being simulated by a hardware simulation program 352, such as Process Simulate, that simulates operation of robot 353. In some instances, a software program block of TIA portal may have a tag, such as a signal associated with a function block, that has unknown connections. Such an instance might occur when the design project is initially created by a different engineer, and when the present engineer opens the project in the engineering tool, the tag name has no recognizable meaning. The AI module 210 evaluates the functional clustering 300 and determines that Sig. A and Sig. B belong to a cluster 312 that identifies the particular function FB_2 (e.g., a gripping function of the robot) for the unknown tags. In this case, the clustering by the AI module 210 or inference engine 220 included an inference that bridged the software elements of TIA portal with hardware elements of the hardware simulation program, which was not possible for the engineer to achieve using the engineering tool alone. Undesirable alternatives include an engineer having to visit the physical plant and perform a physical check to follow the wire from the PLC to the end device, or to spend hours or days to familiarize and understand the project through exploration of the design using engineering software tools, both of which being inefficient solutions to say the least. Returning to FIG. 3B, the signal tags Sig. A and Sig. B corresponds to both to a list of specific blocks of software related to sensors that communicate the signals from the robot to a PLC in the TIA Portal program, and to feedback signals for some specific tasks performed by the robot in the hardware simulation program. As such, the AI module 210 and/or inference engine 220 can answer the question as to which software and hardware must be engineered in Tia Portal to achieve the corresponding functionality for the robot. For example, in an embodiment, the user may query the AI-based assistant feature 235 to classify the elements for signal tags Sig. A and Sig. B, and the response may be a graphical display of the target nodes highlighted (e.g., using a different color than other nodes) within the functional cluster to which the nodes belong. In other embodiments, the AI-based assistant 235 may respond to the query with a textual message that identifies the functional classification of the target nodes (e.g., sensor signals related to robot gripping function block FB_2 for robot cluster 312). As another example, the AI-based assistant may identify which signal tags are not connected to the hardware simulation.

In an aspect, the AI module 210 and/or inference engine 220 may fill gaps, such as missing blocks in the design project, by recognizing context in the knowledge graph. For example, as an engineer works the design project in an engineering tool, such as a TIA Portal program, the AI modules 210 may scan the knowledge graph and recognize context contributed by the hardware simulation and prompt the engineer that there appears to be tags omitted in the design project related to the robot cluster, which likely should be added in the TIA Portal. For example, as the engineer selects design elements to be associated with the robot design, perhaps entering parameters for each new element, and then moves to another component for the project, the AI module 210 or inference engine 220 may detect that the design aspects for the robot are incomplete and send a notification to the user at the TIA portal interface via AI-based assistant 235 that elements for Sig. A and Sig. B need to be connected to sensors in accordance with the functional clustering learned from knowledge graph contribution by the hardware simulator program. This aspect of the AI-based assistant feature 235 ensures that the engineer does not overlook design elements, and can thereby fill the gaps.

Figure 4:
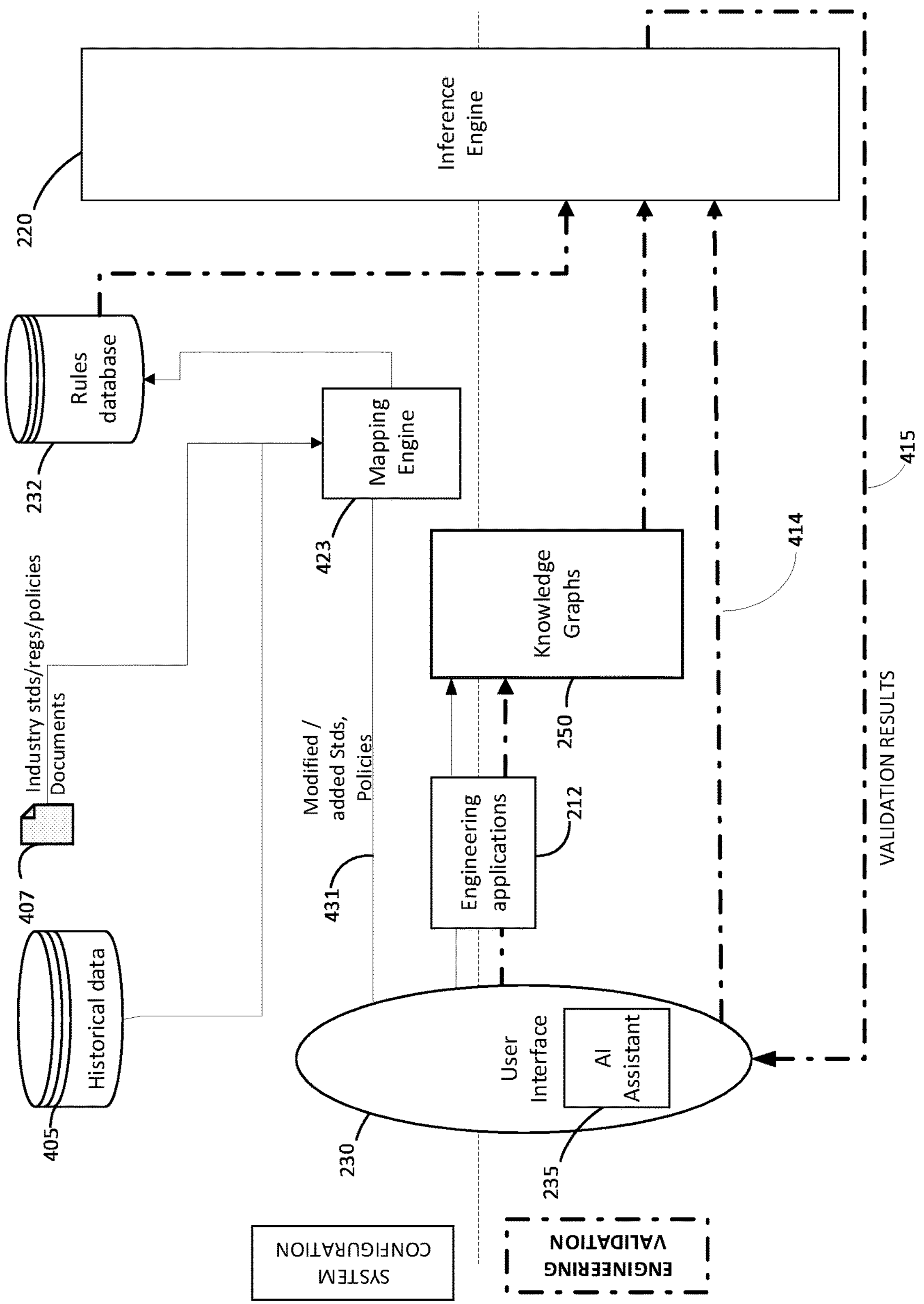
FIG. 4 shows a flowchart for an example of an industrial AI-based compliance verification in accordance with embodiments of the disclosure.

FIG. 4 shows a flowchart for an example of an industrial AI-based compliance verification in accordance with embodiments of the disclosure. Validation of engineering design data is performed by automatically verifying compliance against policies, regulations, and/or standards according to a system configuration phase and an engineering data validation phase. In an embodiment, the system configuration phase involves a mapping engine 423 performing an automatic extraction of industry standards, regulations and policies from documents 407 and/or rules database 232. Such information can be fed to mapping engine 423 in a configuration phase by determining standards and policies that are relevant to planned engineering projects. For example, extraction of information from documents 407 may be implemented by text mining, optical character recognition (OCR), NLP, and/or other similar language processing algorithms (e.g., processing scanned documents or electronic file versions of documents). In an aspect, the mapping of standards, policy, and/or regulation information is based on extracted historical project data 405. In an aspect, mapping engine 423 may receive input 431 from user interface 230 in the form of modifications or addition of industry standards, policies or regulation information stored in rules database 232 which can be stored in the rules database 232 based on the ontology. In some embodiments, rule-sets can be predefined and included with the ontology acquired when configuring the knowledge graph 250 during the configuration phase as described for classification in FIG. 2.

In an embodiment, the engineering data validation involves inference engine 220 validates standards, policies as represented in the rules database 232 against the new engineering data represented in the knowledge graph 250. An example of such an inference engine can be a SPARQL endpoint in case standards, policies are expressed as SPARQL queries. Using a pre-trained knowledge representation of policies and standards represented as semantic data, the inference engine 220 compares the current state of the project to the semantic data for detecting the potential violations. In response to a detected discrepancy, the inference engine 220 sends a validation message 415 to user interface 230, which may be displayed in the AI-based assistant feature 235 on a display of the computing device to include an indication of the potential violation, a recommendation for how to fix the violation, or a combination of both. Alternatively, inference engine 220 can be receive a direct query 414 from user interface 230 relating to regulation compliance for a system component or a subsystem of components and respond with information regarding any detected discrepancy or violation, or an indication of compliance if no discrepancy or violation is detected. In the event of modification to the design resulting from the validation result 415, the system configuration may repeat to ensure proper mapping of relevant rules in knowledge graph 250 is maintained.

As an illustrative example of rule based engineering validation, using the knowledge graph 250, the industrial AI module 210 views the system design with contextual perspective, such as identifying a motor belonging to a conveyor cluster that has known safety constraints, while the motor component is not presently designed with any parameters to address such a constraint (e.g., conveyor speed, forward/reverse advancement limits, etc.). This identified discrepancy, identified by functionality clustering, may then be reported to the user while engaged in the engineering application as the target motor is being added to the design for the project. For example, a message may appear in the AI-based assistant feature 235 on the user interface 230: "motor 125B drives conveyor 23 and is missing speed and advancement parameters". Examples of encoding a rule to discover discrepancies with standard or policy compliance may include: "Mandatory parameter is missing: speed"; "Mandatory parameter is missing: advancement"; Mandatory parameter(s) missing: speed, advancement.

Figure 5:
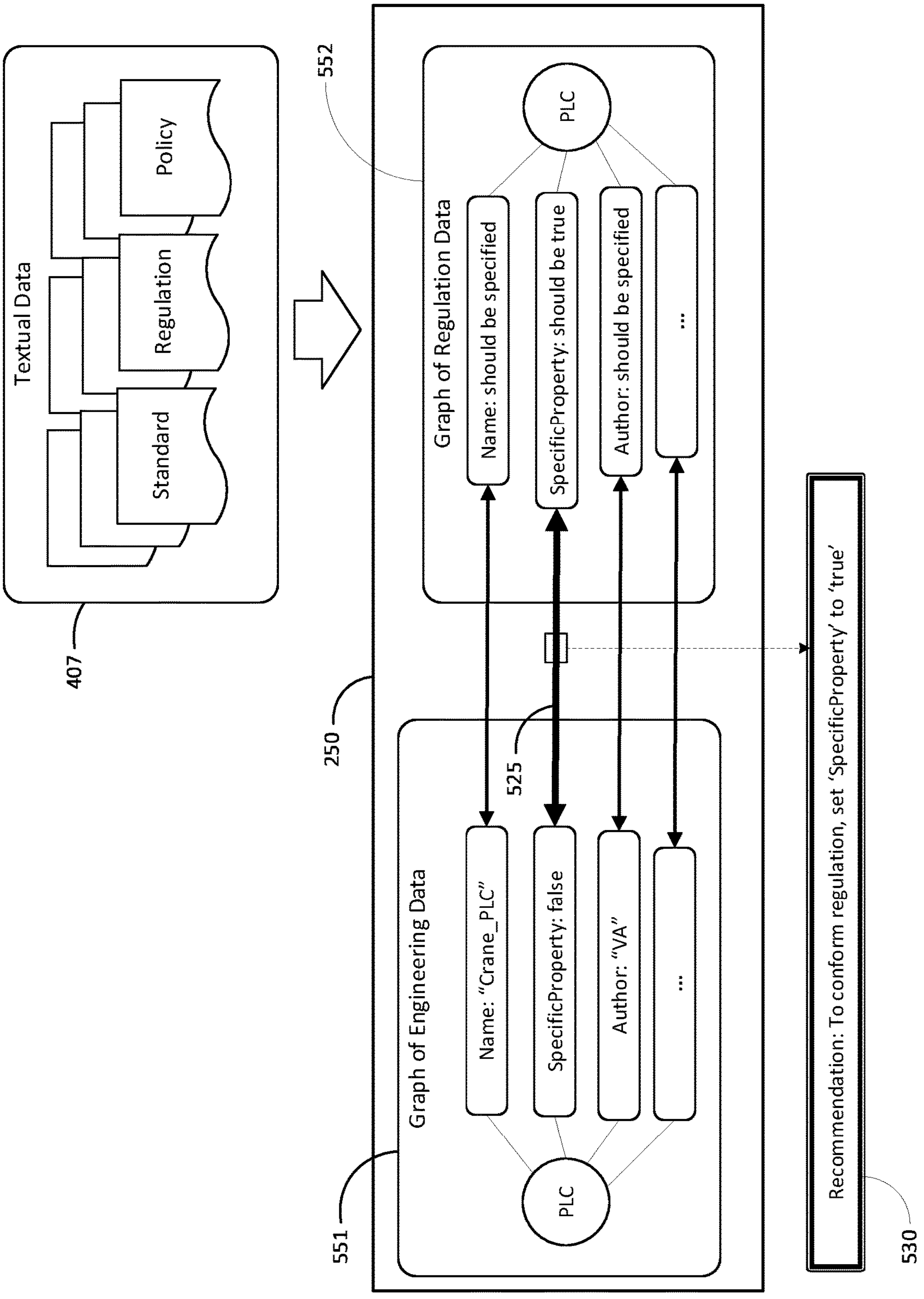
FIG. 5 shows an example of an automatic compliance verification process in accordance with embodiments of this disclosure.

FIG. 5 shows an example of an automatic compliance verification process in accordance with embodiments of this disclosure. In an embodiment, the AI-based assistant 235 is running as a service in the background during a design project being engineered using an engineering tool. During initialization of the design project, knowledge graph 250 is built based on the present state of design project (e.g., accessing a previous design project as a template for the present design project) and includes an engineering data graph 551 and a regulation data graph 552 (e.g., as separate sub-graphs). As part of the system configuration, the industrial AI-based system downloads or accesses from a provider textual regulation data 407, which is then mapped by mapping engine 423 to a semantic knowledge graph representation 552 of the corresponding standards, regulations and policies. The regulatory data may be pre-compiled accordingly. During an engineering data validation phase (e.g., during or following operation of engineering design tools for design project, and following the configuration phase), the inference engine 210 monitors the knowledge graph 250 and recognizes discrepancy 525 between the engineering data graph 551 and the regulation data graph 552 as a potential non-compliance for the target component and informs the engineer by way of a visual notification 530 or message in the AI-based assistant feature 235 that appears in a portion of the display screen. In this example, the regulation data element requires SpecificProperty should be true as shown in data graph 552, while the design element for SpecificProperty is false in the engineering data graph 551, leading to detected discrepancy 525. In such a case, the triggered recommendation 530 in AI-based assistant 235 may read "To conform regulation, set 'SpecificProperty' to 'true'". Generally, the recommendation may include a suggested change of a setting, parameter, variable, or the like, with respect to a target component.

To provide a comprehensive modelling of the engineering domain, data pertaining to standards, regulations and policies are modelled as semantic data in knowledge graph 250, shown as regulation data graph 552. This semantic data can be expressed as constraints over the ontology. In an embodiment, the knowledge graph 250 is constructed using RDF syntax (triples), which can express standards, regulations or policies as SHACL (shapes constraint language) or SPIN constraints over the ontology (e.g., a naming format convention for knowledge graph nodes that must be followed). Alternatively, the constraints can be directly expressed as graph queries over the knowledge graph 250, for example as SPARQL or Gremlin queries.

Figure 6:
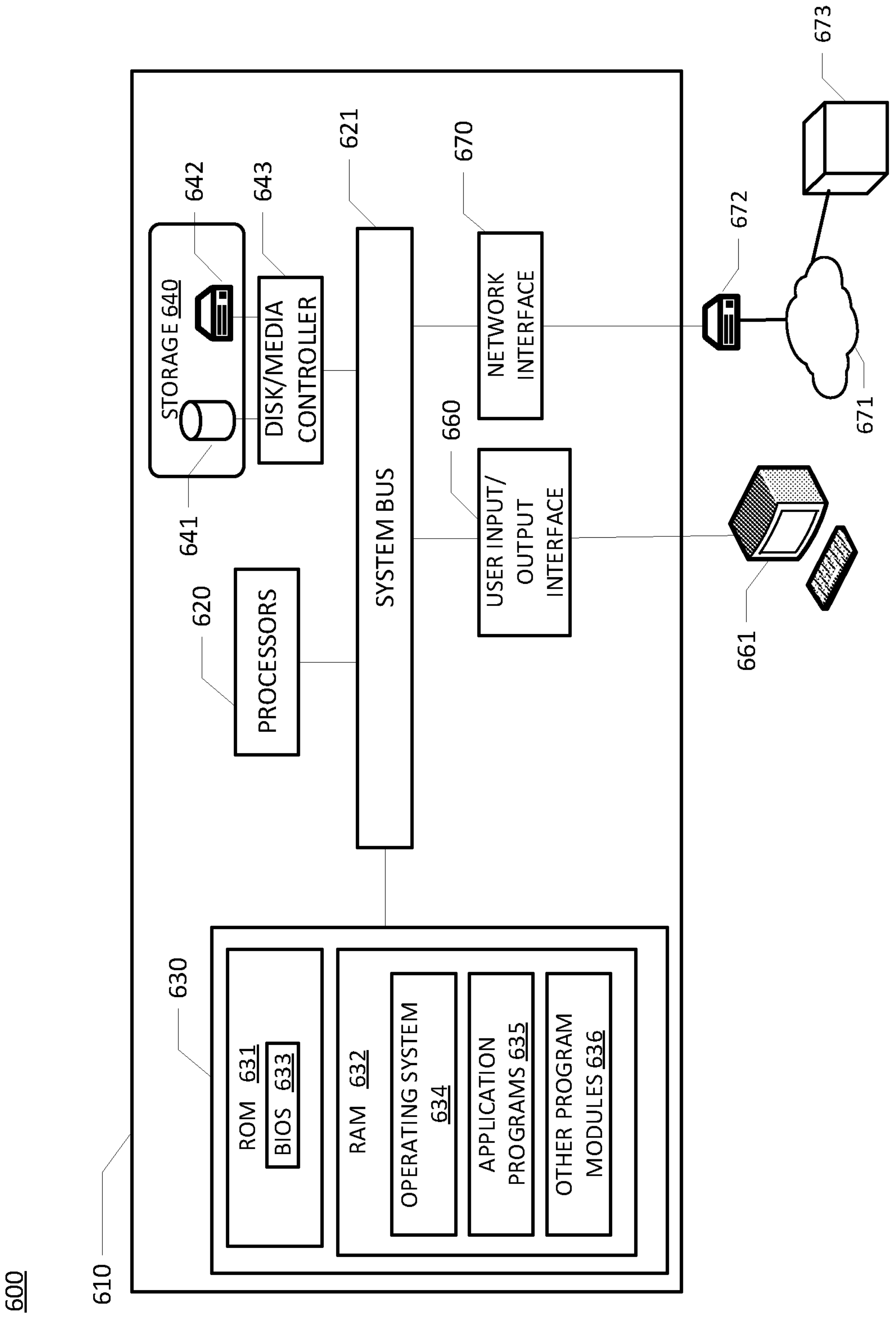
FIG. 6 shows an exemplary computing environment within which embodiments of the disclosure may be implemented.

FIG. 6 illustrates an example of a computing environment within which embodiments of the present disclosure may be implemented. A computing environment 600 includes a computer system 610 that may include a communication mechanism such as a system bus 621 or other communication mechanism for communicating information within the computer system 610. The computer system 610 further includes one or more processors 620 coupled with the system bus 621 for processing the information. In an embodiment, computing environment 600 corresponds to system for industrial AI-based functionality classification and validation of engineering data in a computer aided design project, in which the computer system 610 relates to a computer described below in greater detail.

The processors 620 may include one or more central processing units (CPUs), graphical processing units (GPUs), or any other processor known in the art. More generally, a processor as described herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general purpose computer. A processor may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 620 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor may be capable of supporting any of a variety of instruction sets. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

The system bus 621 may include at least one of a system bus, a memory bus, an address bus, or a message bus, and may permit exchange of information (e.g., data (including computer-executable code), signaling, etc.) between various components of the computer system 610. The system bus 621 may include, without limitation, a memory bus or a memory controller, a peripheral bus, an accelerated graphics port, and so forth. The system bus 621 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnects (PCI) architecture, a PCI-Express architecture, a Personal Computer Memory Card International Association (PCMCIA) architecture, a Universal Serial Bus (USB) architecture, and so forth.

Continuing with reference to FIG. 6, the computer system 610 may also include a system memory 630 coupled to the system bus 621 for storing information and instructions to be executed by processors 620. The system memory 630 may include computer readable storage media in the form of volatile and/or nonvolatile memory, such as read only memory (ROM) 631 and/or random access memory (RAM) 632. The RAM 632 may include other dynamic storage device(s) (e.g., dynamic RAM, static RAM, and synchronous DRAM). The ROM 631 may include other static storage device(s) (e.g., programmable ROM, erasable PROM, and electrically erasable PROM). In addition, the system memory 630 may be used for storing temporary variables or other intermediate information during the execution of instructions by the processors 620. A basic input/output system 633 (BIOS) containing the basic routines that help to transfer information between elements within computer system 610, such as during start-up, may be stored in the ROM 631. RAM 632 may contain data and/or program modules that are immediately accessible to and/or presently being operated on by the processors 620. System memory 630 may additionally include, for example, operating system 634, application modules 635, and other program modules 636. Application modules 635 may include aforementioned modules described for FIG. 1 and may also include a user portal for development of the application program, allowing input parameters to be entered and modified as necessary.

The operating system 634 may be loaded into the memory 630 and may provide an interface between other application software executing on the computer system 610 and hardware resources of the computer system 610. More specifically, the operating system 634 may include a set of computer-executable instructions for managing hardware resources of the computer system 610 and for providing common services to other application programs (e.g., managing memory allocation among various application programs). In certain example embodiments, the operating system 634 may control execution of one or more of the program modules depicted as being stored in the data storage 640. The operating system 634 may include any operating system now known or which may be developed in the future including, but not limited to, any server operating system, any mainframe operating system, or any other proprietary or non-proprietary operating system.

The computer system 610 may also include a disk/media controller 643 coupled to the system bus 621 to control one or more storage devices for storing information and instructions, such as a magnetic hard disk 641 and/or a removable media drive 642 (e.g., floppy disk drive, compact disc drive, tape drive, flash drive, and/or solid state drive). Storage devices 640 may be added to the computer system 610 using an appropriate device interface (e.g., a small computer system interface (SCSI), integrated device electronics (IDE), Universal Serial Bus (USB), or FireWire). Storage devices 641, 642 may be external to the computer system 610.

The computer system 610 may include a user input/output interface 660 for translating signals to and from input/output devices 661, which may comprise one or more input devices, such as a keyboard, touchscreen, tablet and/or a pointing device, and output devices such as a display (e.g., on which GUI 151 may be displayed), for interacting with a computer user and providing information to the processors 620.

The computer system 610 may perform a portion or all of the processing steps of embodiments of the invention in response to the processors 620 executing one or more sequences of one or more instructions contained in a memory, such as the system memory 630. Such instructions may be read into the system memory 630 from another computer readable medium of storage 640, such as the magnetic hard disk 641 or the removable media drive 642. The magnetic hard disk 641 and/or removable media drive 642 may contain one or more data stores and data files used by embodiments of the present disclosure. The data store 640 may include, but are not limited to, databases (e.g., relational, object-oriented, etc.), file systems, flat files, distributed data stores in which data is stored on more than one node of a computer network, peer-to-peer network data stores, or the like. Data store contents and data files may be encrypted to improve security. The processors 620 may also be employed in a multi-processing arrangement to execute the one or more sequences of instructions contained in system memory 630. In alternative embodiments, hard-wired circuitry may be used in place of or in combination with software instructions. Thus, embodiments are not limited to any specific combination of hardware circuitry and software.

As stated above, the computer system 610 may include at least one computer readable medium or memory for holding instructions programmed according to embodiments of the invention and for containing data structures, tables, records, or other data described herein. The term "computer readable medium" as used herein refers to any medium that participates in providing instructions to the processors 620 for execution. A computer readable medium may take many forms including, but not limited to, non-transitory, non-volatile media, volatile media, and transmission media. Non-limiting examples of non-volatile media include optical disks, solid state drives, magnetic disks, and magneto-optical disks, such as magnetic hard disk 641 or removable media drive 642. Non-limiting examples of volatile media include dynamic memory, such as system memory 630. Non-limiting examples of transmission media include coaxial cables, copper wire, and fiber optics, including the wires that make up the system bus 621. Transmission media may also take the form of acoustic or light waves, such as those generated during radio wave and infrared data communications.

Computer readable medium instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, may be implemented by computer readable medium instructions.

The computing environment 600 may further include the computer system 610 operating in a networked environment using logical connections to one or more remote computers, such as remote computing device 673. The network interface 670 may enable communication, for example, with other remote devices 673 or systems and/or the storage devices 641, 642 via the network 671. Remote computing device 673 may be a personal computer (laptop or desktop), a mobile device, a server, a router, a network PC, a peer device or other common network node, and typically includes many or all of the elements described above relative to computer system 610. When used in a networking environment, computer system 610 may include modem 672 for establishing communications over a network 671, such as the Internet. Modem 672 may be connected to system bus 621 via user network interface 670, or via another appropriate mechanism.

Network 671 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 610 and other computers (e.g., remote computing device 673). The network 671 may be wired, wireless or a combination thereof. Wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 671.

It should be appreciated that the program modules, applications, computer-executable instructions, code, or the like depicted in FIG. 6 as being stored in the system memory 630 are merely illustrative and not exhaustive and that processing described as being supported by any particular module may alternatively be distributed across multiple modules or performed by a different module. In addition, various program module(s), script(s), plug-in(s), Application Programming Interface(s) (API(s)), or any other suitable computer-executable code hosted locally on the computer system 610, the remote device 673, and/or hosted on other computing device(s) accessible via one or more of the network(s) 671, may be provided to support functionality provided by the program modules, applications, or computer-executable code depicted in FIG. 6 and/or additional or alternate functionality. Further, functionality may be modularized differently such that processing described as being supported collectively by the collection of program modules depicted in FIG. 6 may be performed by a fewer or greater number of modules, or functionality described as being supported by any particular module may be supported, at least in part, by another module. In addition, program modules that support the functionality described herein may form part of one or more applications executable across any number of systems or devices in accordance with any suitable computing model such as, for example, a client-server model, a peer-to-peer model, and so forth. In addition, any of the functionality described as being supported by any of the program modules depicted in FIG. 6 may be implemented, at least partially, in hardware and/or firmware across any number of devices.

It should further be appreciated that the computer system 610 may include alternate and/or additional hardware, software, or firmware components beyond those described or depicted without departing from the scope of the disclosure. More particularly, it should be appreciated that software, firmware, or hardware components depicted as forming part of the computer system 610 are merely illustrative and that some components may not be present or additional components may be provided in various embodiments. While various illustrative program modules have been depicted and described as software modules stored in system memory 630, it should be appreciated that functionality described as being supported by the program modules may be enabled by any combination of hardware, software, and/or firmware. It should further be appreciated that each of the above-mentioned modules may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other modules. Further, one or more depicted modules may not be present in certain embodiments, while in other embodiments, additional modules not depicted may be present and may support at least a portion of the described functionality and/or additional functionality. Moreover, while certain modules may be depicted and described as sub-modules of another module, in certain embodiments, such modules may be provided as independent modules or as sub-modules of other modules.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure. In addition, it should be appreciated that any operation, element, component, data, or the like described herein as being based on another operation, element, component, data, or the like can be additionally based on one or more other operations, elements, components, data, or the like. Accordingly, the phrase "based on," or variants thereof, should be interpreted as "based at least in part on."

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A system for computer aided design, comprising:

a computing device comprising a processor; and a memory having modules stored thereon for execution by the processor, comprising:

an engineering software tool configured to construct a graphical design of an industrial system for a design project, the graphical design comprising a plurality of components;

an artificial intelligence (AI) module integrated with the engineering tool during a current project, configured to communicate with a remote server-based AI module having a trained machine learning-based model that classifies components for a current project with contextualization according to functionality, the remote AI module configured to:

receive a knowledge graph for the current project based on data associated with the graphical design, the knowledge graph comprising nodes and edges representing an ontology for a set of elements and element relationships respectively, wherein the set of elements includes the plurality of components;

identify a functionality for each knowledge graph node based on the classifier model; and generate clusters of knowledge graph nodes according to the identified functionality such that the knowledge graph nodes are delineated into the clusters differing according to the identified functionality, wherein the clusters comprise a first functional cluster related to a first functionality and a second functional cluster related to a second functionality different from the first functionality, wherein the first and second functional clusters overlap by having a common node that is related to both first equipment in the first functional cluster and second equipment in the second functional cluster; and a graphical user interface configured to display an AI-based assistant feature that receives user queries related to classification of components according to functionality, the knowledge graph nodes being altered to indicate which of the clusters that the knowledge graph nodes belong to;

wherein the remote AI module generates functionality-based recommendations based on the clusters in response to the queries.

2. The system of claim 1, wherein the remote AI module is further configured to generate a cluster diagram having distinct functionality clusters, the system further comprising:

a graphical user interface configured to display the cluster diagram as another AI-based assistant feature to provide a visual aid to the user with functionality classifications in the graphical design.

3. The system of claim 1, wherein the remote AI module is further configured to:

identify missing information in the design based on the clustering; and generate recommendations for the design on the AI-based assistant feature responsive to identifying missing information related to the design.

4. The system of claim 1, further comprising:

an inference engine configured to:

classify functionality of project components by extracting structure features from the knowledge graph and applying a rule based inference analysis to the extracted structure using rules stored in a rules database; and send a message to the AI-based assistant feature with a textual description of the functional classification of a target component.

5. The system of claim 1, wherein the AI module is further configured to:

receive a user query pertaining to functionality of a target component;

determine the functionality of the component based on the clustering in response to the query; and send a message to the AI-based assistant feature with a textual description of the functional classification of the target component.

6. The system of claim 1, wherein the remote AI module is further configured to: detect gaps in the design project; and send a message to the AI-based assistant feature notifying the user that one or more elements for a functionality cluster are missing.

7. The system of claim 1, further comprising:

a mapping engine configured to map to the knowledge graph in the form of regulation data, rules pertaining to polices, regulations, standards, or a combination thereof, for compliance of components; and an inference engine configured to:

determine discrepancies between engineering data in the knowledge graph and the regulation data in the knowledge graph for a target component; and send a message to the AI-based assistant feature notifying the user that a potential non-compliance is detected for the target component.

8. The system of claim 1, wherein the remote AI module is configured to:

determine that a node of the knowledge graph nodes has a functionality that does not map to any of the clusters; and in response to determining the node has the functionality that does not map to any of the clusters, recommend replacing the node with another node or removing the node from the current project.

9. The system of claim 1, wherein the first functional cluster comprises a first node of a first signal and a second node of a second signal different from the first signal.

10. A method for computer aided design, comprising:

training a machine learning-based model using training data obtained from previous design projects to construct a trained machine learning-based model that classifies functionality of components for a current project;

constructing, by an engineering software tool, a graphical design of an industrial system for a design project, the graphical design comprising a plurality of components;

constructing a knowledge graph for the current project based on data associated with the graphical design, the knowledge graph comprising nodes and edges representing an ontology for a set of elements and element relationships respectively, wherein the set of elements includes the plurality of components;

running an artificial intelligence (AI) module integrated with the engineering tool during the current project, wherein the AI module uses the trained machine learning-based model to classify functionality of project components, comprising:

identifying a functionality for each knowledge graph node based on the classifier model;

clustering knowledge graph nodes according to identified functionality such that the knowledge graph nodes are delineated into clusters differing according to the identified functionality, wherein the clusters comprise a first functional cluster related to a first functionality and a second functional cluster related to a second functionality different from the first functionality, wherein the first and second functional clusters overlap by having a common node that is related to both first equipment in the first functional cluster and second equipment in the second functional cluster; and displaying an AI-based assistant feature that receives user queries related to classification of components according to functionality, the knowledge graph nodes being altered to indicate which of the clusters that the knowledge graph nodes belong to;

wherein a remote AI module generates functionality-based recommendations based on the clusters in response to the queries.

11. The method of claim 10, further comprising:

generating and displaying a cluster diagram having distinct functionality clusters on a portion of a display as another AI-based assistant feature based on the clustering to provide a visual aid to the user with functionality classifications in the graphical design.

12. The method of claim 10, further comprising:

identifying, by the AI module, missing information in the design based on the clustering; and generating and displaying recommendations for the design on the AI-based assistant feature responsive to identifying missing information related to the design.

13. The method of claim 10, further comprising:

classifying functionality of project components by extracting structure features from the knowledge graph and applying a rule based inference analysis to the extracted structure using rules stored in a rules database; and sending a message to the AI-based assistant feature with a textual description of the functional classification of a target component.

14. The method of claim 10, further comprising:

receiving a user query pertaining to functionality of a target component;

determining the functionality of the component based on the clustering in response to the query; and sending a message to the AI-based assistant feature with a textual description of the functional classification of the target component.

15. The method of claim 10, further comprising:

detecting gaps in the design project;

sending a message to the AI-based assistant feature notifying the user that one or more elements for a functionality cluster are missing.

16. The method of claim 10, further comprising:

mapping, by a mapping engine, to the knowledge graph in the form of regulation data, rules pertaining to polices, regulations, standards, or a combination thereof, for compliance of components;

determining, by an inference engine, discrepancies between engineering data in the knowledge graph and the regulation data in the knowledge graph for a target component; and sending a message to the AI-based assistant feature notifying the user that a potential non-compliance is detected for the target component.

* * * * *